United States Patent
Schnell et al.

(10) Patent No.: US 7,579,836 B2
(45) Date of Patent: Aug. 25, 2009

(54) MULTI-LAYER RESONATOR FOR MAGNETIC RESONANCE APPLICATIONS WITH THE RESONATOR STRUCTURE ITSELF ALLOWING EQUAL MAGNITUDE CURRENT DURING ACTIVE OPERATION

(75) Inventors: Wilfried Schnell, Forchheim (DE); Markus Vester, Nürnberg (DE)

(73) Assignee: Siemens Aktiengesellschaft, Munich (DE)

( * ) Notice: Subject to any disclaimer, the term of this patent is extended or adjusted under 35 U.S.C. 154(b) by 35 days.

(21) Appl. No.: 11/994,019

(22) PCT Filed: Jan. 30, 2007

(86) PCT No.: PCT/EP2007/050868

§ 371 (c)(1),
(2), (4) Date: Dec. 27, 2007

(87) PCT Pub. No.: WO2007/118719

PCT Pub. Date: Oct. 25, 2007

(65) Prior Publication Data

US 2008/0164960 A1 Jul. 10, 2008

(30) Foreign Application Priority Data

Apr. 13, 2006 (DE) .................. 10 2006 017 438

(51) Int. Cl.
*G01V 3/00* (2006.01)
*H01P 7/08* (2006.01)
(52) U.S. Cl. .................. 324/318; 324/322; 333/219.2; 333/219
(58) Field of Classification Search ......... 324/300–322; 600/407–435; 333/219–235
See application file for complete search history.

(56) References Cited

U.S. PATENT DOCUMENTS

| 2,769,148 | A | | 10/1956 | Clogston ............... 333/236 |
| 5,049,821 | A | | 9/1991 | Duensing et al. ......... 324/322 |
| 6,054,858 | A | * | 4/2000 | Dumoulin et al. ......... 324/322 |

(Continued)

FOREIGN PATENT DOCUMENTS

EP 1 486 793 12/2004

(Continued)

OTHER PUBLICATIONS

"Thin-Film HTS Probe Coils for Magnetic Resonance Imaging," Withers et al, IEEE Trans. On Applied Superconductivity, vol. 3, No. 1 (Mar. 1993), pp. 2450-2453.

*Primary Examiner*—Brij B. Shrivastav
*Assistant Examiner*—Tiffany A Fetzner
(74) *Attorney, Agent, or Firm*—Schiff Hardin LLP

(57) ABSTRACT

A resonator for magnetic resonance applications has a conductor element proceeding in an extension direction, that operates with a resonance current at a resonance frequency oscillating therein in the extension direction. The conductor element is tuned to the resonance frequency and has an overall length in the extension direction that is smaller than half of the wavelength of the resonance frequency. The conductor element is a multi-layer conductor with layers that are electrically insulated from each other that, in said extension direction, have layer ends that are capacitively coupled with each other. During operation of the conductor element at the resonance frequency, respective layer currents flow in the layers in the extension direction that are substantially equal in magnitude.

10 Claims, 3 Drawing Sheets

U.S. PATENT DOCUMENTS

| | | | |
|---|---|---|---|
| 6,081,120 A * | 6/2000 | Shen | 324/318 |
| 6,148,221 A | 11/2000 | Ishikawa et al. | 505/210 |
| 6,492,817 B2 * | 12/2002 | Gebhardt et al. | 324/318 |
| 6,788,059 B2 | 9/2004 | Lee et al. | 324/319 |
| 7,081,753 B2 * | 7/2006 | Mullen et al. | 324/318 |
| 7,136,023 B2 * | 11/2006 | Reykowski | 343/742 |
| 2001/0050176 A1 * | 12/2001 | Gebhardt et al. | 174/68.1 |
| 2004/0066195 A1 * | 4/2004 | Reykowski | 324/319 |
| 2006/0017438 A1 * | 1/2006 | Mullen et al. | 324/318 |
| 2007/0120629 A1 * | 5/2007 | Schnell et al. | 333/219 |
| 2008/0150643 A1 * | 6/2008 | Suzuki et al. | 331/107 R |
| 2008/0164960 A1 * | 7/2008 | Schnell et al. | 333/219.2 |

FOREIGN PATENT DOCUMENTS

WO  WO 97/26560  7/1997

* cited by examiner

MULTI-LAYER RESONATOR FOR MAGNETIC RESONANCE APPLICATIONS WITH THE RESONATOR STRUCTURE ITSELF ALLOWING EQUAL MAGNITUDE CURRENT DURING ACTIVE OPERATION

BACKGROUND OF THE INVENTION

1. Field of the Invention

The present invention concerns a resonator for magnetic resonance applications of the type having a conductor element extending in an extension direction.

2. Description of the Prior Art

Resonators of the above type are generally known.

Like many other resonators, resonators for magnetic resonance applications have a conductor element that extends in an extension direction. Given operation of the conductor element with a resonance frequency, a resonance current oscillates in the extension direction in the conductor element. The resonance current is particularly high when the conductor element is tuned to the resonance frequency.

In magnetic resonance applications the Larmor frequency with which a particular magnetic resonance system is operated depends on the strength of the basic magnetic field of the magnetic resonance system and on the element whose excited spin should be detected. For example, for hydrogen the gyromagnetic ratio is approximately 42.4 MHz/T.

Magnetic resonance systems are typically operated with basic magnetic fields that are between 0.2 and 1.5 T. In more recent times magnetic resonance systems have become known that exhibit stronger basic magnetic fields, in particular basic magnetic fields of 3 T, in some cases even up to 7 T and beyond. The Larmor frequency of such magnetic resonance systems typically lies between 8.5 MHz and approximately 63.5 MHz, but may be beyond this in individual cases.

The Larmor frequency is the frequency to which the resonators should be tuned in magnetic resonance applications. In the ideal case it thus corresponds with the resonance frequency of the resonator.

As is generally known, without further measures a conductor element is resonant at a resonator frequency when its length is an integer multiple of half of the wavelength of the resonance frequency. As results from a back calculation, the length of a λ/2 rod given a magnetic resonance system with a basic magnetic field of 1.5 T is thus approximately 2.5 m. However, such lengths are unrealistic for resonators for magnetic resonance applications. For example, the rods of whole-body antennas exhibit lengths that are at maximum 60 cm. They thus exhibit (as viewed in their extension direction) a length that is not only smaller than half but rather (at least normally) is even smaller than one quarter of the wavelength of the resonance frequency. Local coils are often even smaller. For resonators for magnetic resonance applications, without further measures it is therefore not possible to achieve the tuning to the Larmor frequency only by dimensioning of the conductor element. Rather, it is generally typical to provide suitable circuitry that effects the tuning of the conductor element to the resonance frequency.

The resonance current is in the radio-frequency range. In the propagation of radio-frequency currents, a phenomenon known as the skin effect occurs, such that the resonance current no longer flows in the entire cross-section of the conductor element but rather only in a peripheral region. The peripheral region exhibits a skin depth that is determined by the resonance frequency and the material of the conductor element. Due to the skin effect, the resonance current thus flows only in a fraction of the cross-section of the conductor element, such that the effective resistance of the conductor element rises.

It is conceivable to reduce the effective resistance of the conductor element by cooling or by the use of a superconducting material. However, these procedures have a significant technical expenditure associated therewith and moreover represent a safety risk for a patient who is examined in the magnetic resonance system. In practice these measures are therefore not ever used in magnetic resonance systems.

Theoretically, the use of a radio-frequency strand is conceivable (see WO 97/26560 A1). However, in practice the use of a radio-frequency strand brings no advantages. Stranded conductors reduce the resistance only up to frequencies of a few megahertz, typically 2 to 4 MHz. However, the Larmor frequency normally lies well above this frequency, namely at at least 8.5 MHz.

Conductor elements are known that are fashioned as multi-layer conductors as exemplified by U.S. Pat. Nos. 2,769,148 and 6,148,221. When in such a case the individual layers exhibit layer thicknesses that are smaller than the skin depth, the effective resistance at the resonance frequency can be significantly reduced with such conductor elements. The layers can either be concentric to one another (known as Clogston conductors as in U.S. Pat. No. 2,769,148) or planar (as in U.S. Pat. No. 6,148,221). If such conductor elements could be used in resonators for magnetic resonance applications, this would be advantageous. However, without further measures the use of multi-layer conductors as conductor elements does not lead to the expected reduction of the effective resistance.

More precise examinations have shown that the problem is due to the optimal distribution of the resonance current to the individual layers of the multi-layer conductor after a transition from a solid conductor or an external circuit to the multi-layer conductor ensuing only when this is ensured by corresponding design of the multi-layer conductor or the external circuit. The current distribution can not be adjusted without further measures. Moreover, slight inhomogeneities of the multi-layer conductor already lead to a significant reduction of the achievable resistance reduction. The use of multi-layer conductors in resonators for magnetic resonance applications has conventionally been considered to be unreasonable in practice.

SUMMARY OF THE INVENTION

An object of the present invention is to a resonator for magnetic resonance applications in which the effective resistance is distinctly smaller than given a solid conductor.

The above object is achieved in accordance with the present invention by a resonator of the aforementioned type wherein the conductor element is a multi-layer conductor with a number of layers that are electrically insulated from each other and, as viewed in the extension direction, the layers have layer ends that are capacitively coupled with each other, and the conductor element is designed so that, during operation of the conductor element at the resonance frequency, layer currents that are substantially of the same magnitude relative to each other flow in the respective layers in the extension direction.

By fashioning the conductor element as a multi-layer conductor, the possibility exists for the first time to distinctly reduce the effective resistance of the conductor element relative to a solid conductor. Due to the design of the conductor element that effects the uniform current distribution in the individual layers, this possibility is actually utilized.

In an embodiment of the present invention, the layer ends are arranged at a first conductor end and a second conductor end of the conductor element. In this case the layers are respectively cyclically interchanged at a number of interchange points.

In a design of this embodiment, the interchange points are uniformly arranged as viewed in the extension direction. A particularly uniform current flow thus can be effected in the individual layers.

The relationship $V=k \cdot S/2$ or the relationship $V=(k \cdot S-1)/2$, wherein V is the number of interchange points and S is the number of layers and k is a whole number. The division of the resonance current to the individual layers can be made more uniform by this measure.

When the layers are fashioned as plane layers the cyclical interchange of the layers can be achieved, for example, by folding at least one of the layers at the interchange points.

In a further embodiment, the layers exhibit notches running transverse to the extension direction. This design can be realized as an alternative or in addition to the cyclical interchange of the layers.

In a further embodiment, the conductor element is fashioned as a torus. Dielectrics are arranged between the layers. In this case the layer ends of a layer are respectively separated from one another by a gap as viewed in the extension direction. The gaps are not all arranged at the same point as viewed in the extension direction. The gaps of layers immediately adjacent to one another are advantageously offset along the extension direction by an angle that is slightly less than 180°.

DESCRIPTION OF THE PREFERRED EMBODIMENTS

Figure 1:
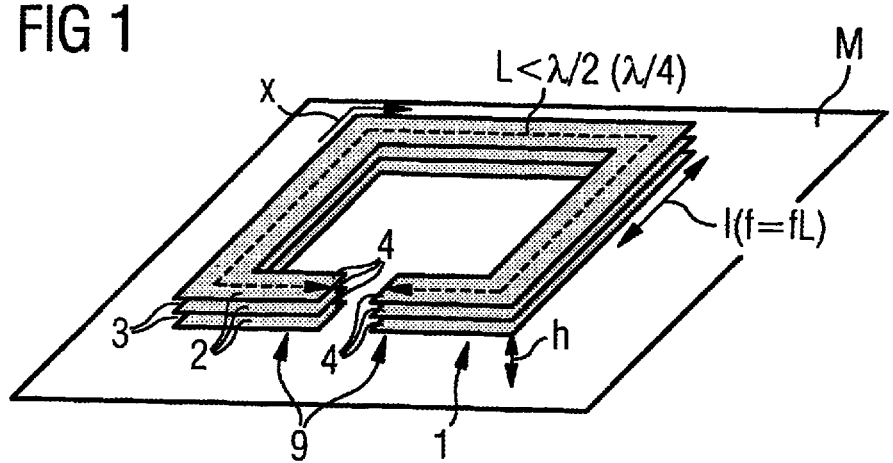
FIGS. 1-3 illustrate the basic design of a resonator for magnetic resonance applications.
Figure 2:
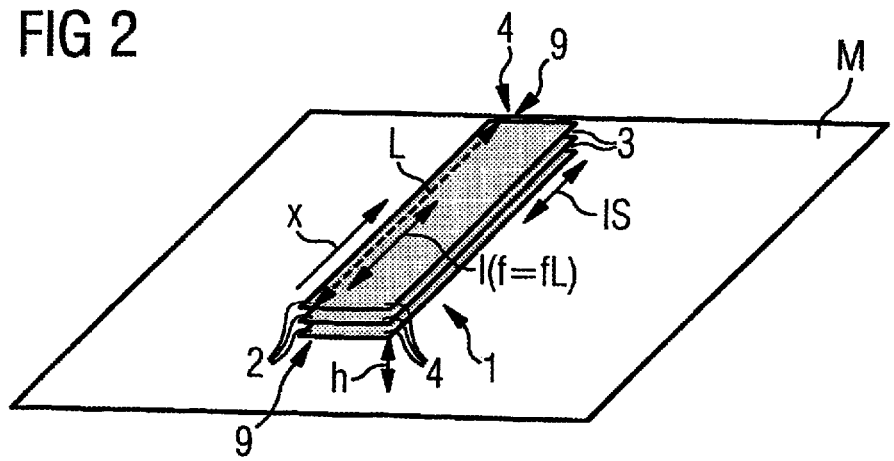
Figure 3:
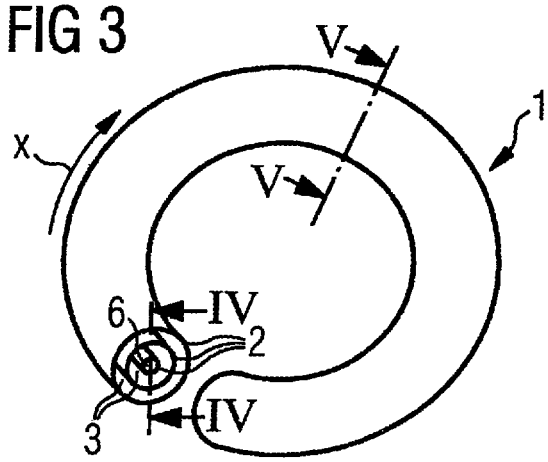

According to FIGS. 1 through 3, a resonator for magnetic resonance applications comprises a conductor element 1 that extends in an extension direction x. Given operation of the conductor element 1 a resonant current I oscillates with a resonance frequency f in the extension direction x in the conductor element 1.

Given magnetic resonance applications the resonance frequency f corresponds with the Larmor frequency fL of a magnetic resonance system. The conductor element 1 therefore extends over a total length L that is significantly smaller than half of the wavelength λ corresponding with the resonance frequency f. For the most part the total length L is even smaller than a quarter of the wavelength λ. Nevertheless, the conductor element 1 is tuned to the resonance frequency f. Details in this regard will be explained further.

The conductor element 1 is fashioned as a multi-layer conductor. It thus comprises a plurality of electrically-conductive layers 2 that are electrically insulated from one another.

In the conductor element 1 of FIGS. 1 and 2 the layer 2 are fashioned as planar layers 2. This embodiment is in particular particularly suitable for whole-body coils. However, in principle the embodiment of FIGS. 1 and 2 is also applicable given other resonators for magnetic resonance applications.

In the embodiment of FIG. 3 the conductor element 1 is fashioned as a torus 1. This embodiment is in particular suitable for local coils. However, in principle the application in other resonators is also possible.

Both in the embodiment of FIGS. 1 and 2 and in the embodiment of FIG. 3, the layers 2 exhibit layers ends 4 as viewed in the extension direction x. the layer ends 4 of each layer 2 are at least capacitively coupled with one another, for example via a ground plane M according to FIG. 2. The conductor element 1 is disposed at a height h above the ground plane M. They can also be connected with one another via a wiring (not shown in FIG. 2).

Figure 4:
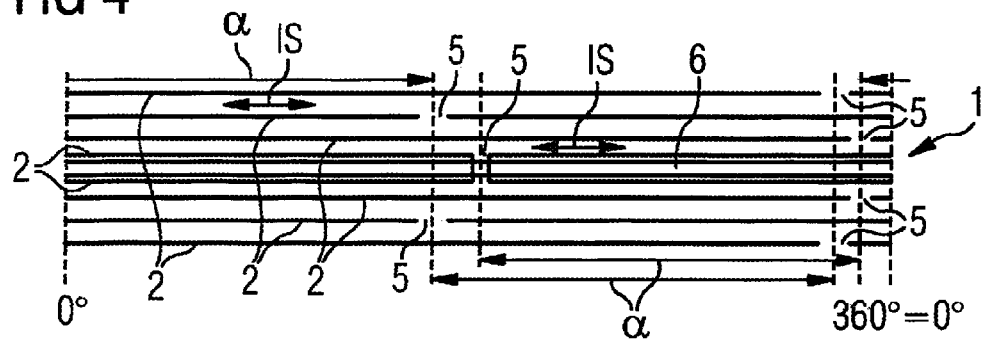
FIG. 4 shows the resonator of FIG. 3 in section, in an "unrolled" illustration.

In the embodiment according to FIG. 3 the layer ends 4 of each layer 2 are respectively separated from one another by a gap 5 (see FIG. 4). The gap 5 of the outermost layer 2 can possibly be bridged by means of a capacitor. However, this is not mandatory. A dielectric 3 is respectively arranged between each two layers 2, transverse to the extension direction x. For example, $SiO_2$ and $Al_2O_3$ are considered as material for the dielectric 3. However, other electrically-insulating materials are also possible. They should be optimally low-loss.

In the embodiment according to FIGS. 3 and 4 the individual layers are, for example, applied on an electrically insulating torus core 6 via vacuum deposition or sputtering. The gaps 5 can have been generated via masking or etching processes. According to FIG. 4 they are not all arranged at the same point as viewed in the extension direction x. A trench can thereby be avoided.

The gaps 5 of layers 2 immediately adjacent to one another are advantageously offset by an angle α as viewed in the reception device x (see FIG. 4 again). The angle α can in principle assume an arbitrary value. It is advantageously slightly less than 180°.

The resonance frequency f of the conductor element 1 of FIGS. 3 and 4 is determined by the dimensions of the torus 1 and by the number, the thickness and the material of the dielectrics 3 as well as by the angle α. The electrical connection of the conductor element 1 can ensue at the outermost layer 2. The inner layers 2 are in this case inductively and capacitively coupled. However, it is also possible to couple the conductor element of FIGS. 3 and 4 inductively by means of an external coupling loop.

Figure 5:
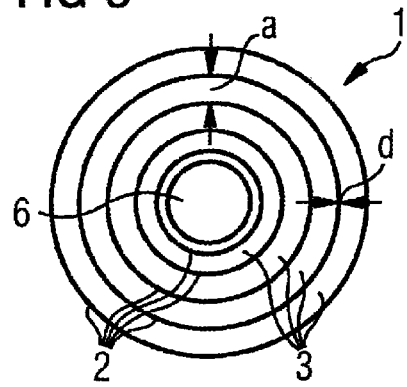
FIG. 5 shows the resonator of FIG. 3 in cross-section.

By the suitable selection of material and thickness d of the layers 2 as well as of material of the dielectrics 3 and spacing a of the layers 2 (see FIG. 5) it can be achieved that layer currents IS that are at least essentially of the same magnitude among one another flow in the extension direction x in the layers 2 given operation of the conductor element 1 with the resonance frequency f in the embodiment according to FIGS. 3 and 4. The term "essentially of the same magnitude" as used herein means that the quotient between the greatest and the smallest of the layer currents IS is smaller than 3. The quotient is advantageously even smaller than 2, in particular smaller than 1.25.

In the embodiments of FIGS. 1 and 2 the conductor element 1 is also fashioned such that layer currents IS that are at least essentially of the same magnitude among one another flow in the extension direction x in the layers 2 given operation of the conductor element 1 with the resonance frequency f. FIGS. 6 through 10 show two different possible embodiments of the conductor element 1 with which this uniform distribution of the layer currents IS can be achieved.

Figure 6:
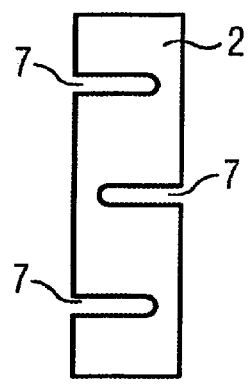
FIG. 6 shows an individual layer of the multi-layer resonator.

According to FIG. 6, notches 7 that run transverse to the extension direction x and thus increase the longitudinal inductance of the respective layer 2 are inserted into the individual layers 2. The respective layer current IS must therefore flow in a meandering manner in the respective layer 2. The notches 7 cause each layer 2 to exhibit the same impedance as the other layers 2 at the resonance frequency f.

Figure 7:
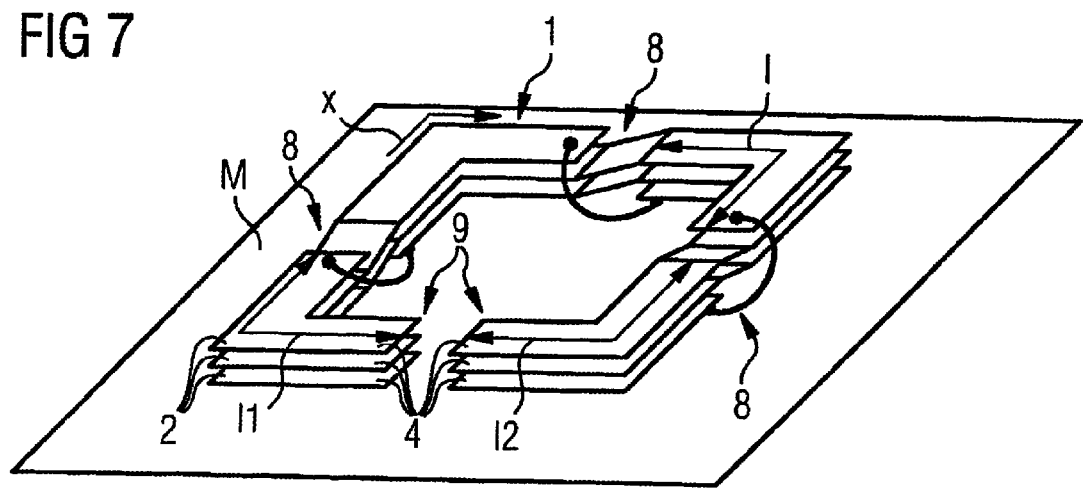
FIG. 7 illustrates a modification of the resonator of FIG. 2.

As an alternative or in addition to the insertion of the notches 7 into the layers 2, according to FIG. 7 it is also possible that the layers 2 are respectively cyclically interchanged at a number of interchange points 8.

The interchange points 8 are advantageously uniformly arranged as viewed in the extension direction x. A segment length l of the conductor element 1 between each two interchange points 8 is thus advantageously constant or, respectively, independent of the selection of the interchange point 8.

The number of interchange points 8 is advantageously selected such that the relationship $V=k \cdot S/2$ or the relationship $V=(k \cdot S-1)/2$ applies, wherein V is the plurality of interchange points 8, S is the number of layers 2 and k is a whole number. This is shown in FIG. 6 for $k=1$ and $V=k \cdot S/2$. The reason that the first alternative ($V=k \cdot S/2$) is presented in the representation from FIG. 7 is that segment section lengths 11, 12 in the embodiment according to FIG. 7 extend to the segment length l. Contrary to this, the alternative $V=(k \cdot S-1)/2$ would have to be selected if the segment section lengths 11, 12 were to satisfy the condition $11=12=l$.

Figure 9:
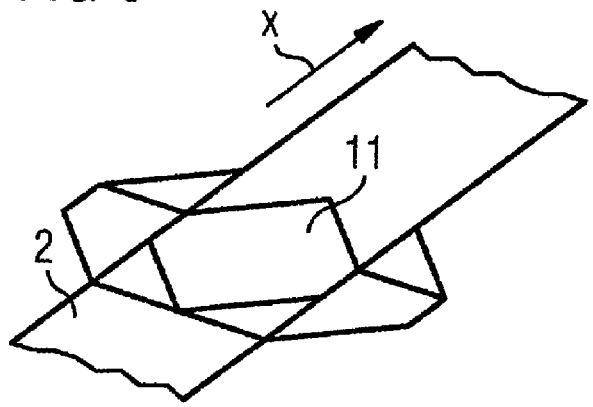
Figure 10:
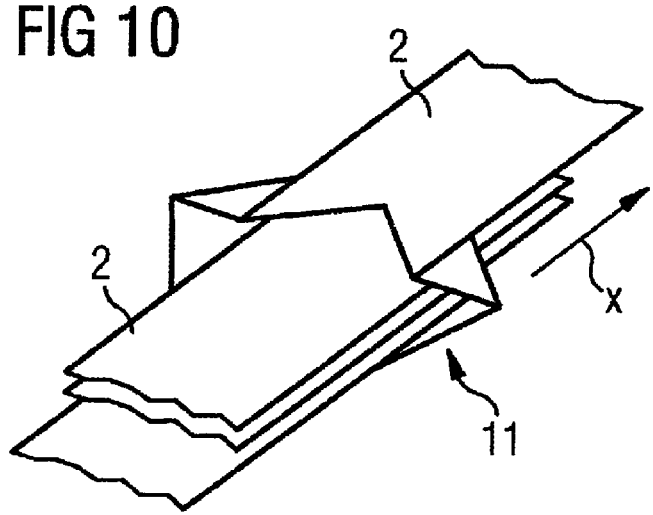

Henceforth a preferred method by means of which the interchange points 8 can be realized is explained in connection with FIGS. 8 through 10.

Figure 8:
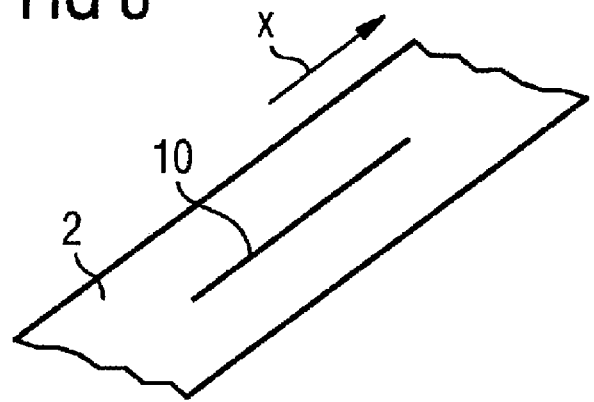
FIGS. 8-10 illustrate an embodiment of a production method for the resonator of FIG. 7.

According to FIG. 8, a slit 10 is respectively introduced centrally into the region of each interchange point 8 in the respective lowermost layer 2. Due to the slit 10 it is possible to fold the lowermost layer 2 in the region of the respective interchange point 8, as this is shown in FIG. 9. An opening 11 through which the other layers 2 can be directed (see FIG. 10) thereby arises in the region of the respective interchange point 9. After the interchange point 8 the previously lowermost layer 2 has henceforth become the uppermost layer 2. The remaining layers 2 have respectively been displaced one downwards. At the interchange points 8 one of the layers 2 is thus respectively folded such that the folding of this layer 2 causes the cyclical interchange of the layers 2.

In accordance with the invention, multi-layer conductors can be used for magnetic resonance applications wherein desired advantage of multi-layer conductors, namely a distinct resistance reduction in the resonance frequency f, can be achieved.

Although modifications and changes may be suggested by those skilled in the art, it is the intention of the inventors to embody within the patent warranted heron all changes and modifications as reasonably and properly come within the scope of their contribution to the art.

We claim as our invention:

1. A resonator configured for magnetic resonance applications comprising:

a conductor element extending in an extension direction between opposite free ends of said conductor element and configured to operate with a resonance current at a resonance frequency oscillating in the conductor element in the extension direction, said conductor element being tuned to said resonance frequency and having a total length in said extension direction that is smaller than half of a wavelength of the resonance frequency;

said conductor element being a multi-layer conductor comprising a plurality of layers that are electrically insulated from each other;

in said extension direction, the respective layers having layer ends that are capacitively coupled with each other; and said multi-layer conductor itself being structurally configured between said opposite free ends to cause layer currents, forming said resonance current at said resonance frequency, to flow in the respective layers in said extension direction that are substantially equal in magnitude relative to each other.

2. A resonator as claimed in claim 1 wherein said layer ends are located respectively at first and second conductor ends of the conductor element, and wherein said layers are cyclically interchanged at a plurality of interchange points.

3. A resonator as claimed in claim 2 wherein said interchange points are uniformly distributed along said extension direction.

4. A resonator as claimed in claim 2 wherein $V=k \cdot S/2$, wherein V is the number of said interchange points, S is the number of said layers, and k is a whole number.

5. A resonator as claimed in claim 2 wherein $V=(k \cdot S-1)/2$, wherein V is the number of said interchange points, S is the number of said layers, and k is a whole number.

6. A resonator as claimed in claim 2 wherein said layers are planar layers, and wherein at least one of said planar layers is folded at said interchange points to produce said cyclical interchange of the layers.

7. A resonator as claimed in claim 1 wherein said layer ends are located at respective first and second conductor ends of the conductor element, and wherein each of said layers has notches therein proceeding transversely to said extension direction.

8. A resonator as claimed in claim 1 wherein said conductor element forms a torus, and comprising dielectric material between the respective layers, and wherein each layer has layer ends separated from each other by a gap in said extension direction, the respective gaps being non-overlapping along said extension direction.

9. A resonator as claimed in claim 8 wherein pairs of said gaps that are immediately adjacent to each other are offset along said extension direction by an angle slightly less than 180°.

10. A resonator as claimed in claim 8 wherein said dielectric material is selected from the group consisting of $SiO_2$ and $Al_2O_3$.

* * * * *